(12) United States Patent
Shukla et al.

(10) Patent No.: US 8,692,238 B2
(45) Date of Patent: Apr. 8, 2014

(54) SEMICONDUCTOR DEVICES AND METHODS OF PREPARATION

(75) Inventors: Deepak Shukla, Webster, NY (US);
Douglas R. Robello, Webster, NY (US);
Mark R. Mis, Hornell, NY (US);
Wendy G. Ahearn, Rochester, NY (US);
Dianne M. Meyer, Hilton, NY (US)

(73) Assignee: Eastman Kodak Company, Rochester, NY (US)

( * ) Notice: Subject to any disclaimer, the term of this patent is extended or adjusted under 35 U.S.C. 154(b) by 164 days.

(21) Appl. No.: 13/455,398

(22) Filed: Apr. 25, 2012

(65) Prior Publication Data

US 2013/0285061 A1    Oct. 31, 2013

(51) Int. Cl.
*H01L 35/24*    (2006.01)

(52) U.S. Cl.
USPC ............. 257/40; 257/57; 257/E51.001

(58) Field of Classification Search
USPC ................. 257/40, 57, E51.001
See application file for complete search history.

(56) References Cited

U.S. PATENT DOCUMENTS

| | | | |
|---|---|---|---|
| 6,232,157 B1 | 5/2001 | Dodabalapur et al. | |
| 6,265,243 B1 | 7/2001 | Katz et al. | |
| 6,372,877 B1 | 4/2002 | Cassidy et al. | |
| 7,279,777 B2 | 10/2007 | Bai et al. | |
| 7,298,023 B2 | 11/2007 | Guillet et al. | |
| 7,326,957 B2 | 2/2008 | Halik et al. | |
| 7,352,038 B2 | 4/2008 | Kelley et al. | |
| 7,482,625 B2 | 1/2009 | Kim et al. | |
| 7,528,448 B2 | 5/2009 | Bailey et al. | |
| 7,638,793 B2 | 12/2009 | Chua et al. | |
| 7,741,635 B2 | 6/2010 | Kim et al. | |
| 7,750,342 B2 | 7/2010 | Kim et al. | |
| 2008/0161464 A1 | 7/2008 | Marks et al. | |
| 2008/0237583 A1 | 10/2008 | Masuda | |
| 2008/0283829 A1 | 11/2008 | Kim et al. | |
| 2010/0084636 A1 | 4/2010 | Lin et al. | |
| 2011/0127504 A1 | 6/2011 | Halls et al. | |
| 2011/0175089 A1 | 7/2011 | Zheng et al. | |
| 2011/0193071 A1 | 8/2011 | Yahagi | |
| 2012/0292626 A1 | 11/2012 | Yahagi | |

FOREIGN PATENT DOCUMENTS

| | | |
|---|---|---|
| EP | 1 679 754 | 7/2006 |
| WO | 2007/129832 | 11/2007 |

OTHER PUBLICATIONS

Janos Veres, et al., "Low-k Insulators as the Choice of Dielectrics in Organic Field-Effect Transistors", Advanced Functional Materials, 2003, 13, No. 3 March, pp. 199-204.

Marcus Halik, et al., "High-mobility organic thin-film transistors based on α,α'-didecyloligothiophenes", Journal of Applied Physics, vol. 93, No. 5, Mar. 1, 2003.

*Primary Examiner* — Anthony Ho
(74) *Attorney, Agent, or Firm* — J. Lanny Tucker

(57) ABSTRACT

An organic film-forming polymer has a $T_g$ of at least 70° C. and comprises a backbone comprising recurring units of Structure (A) shown in this application. These organic film-forming polymers can be used as dielectric materials in various devices with improved properties such as improved mobility.

18 Claims, 2 Drawing Sheets

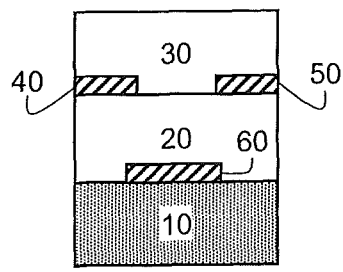
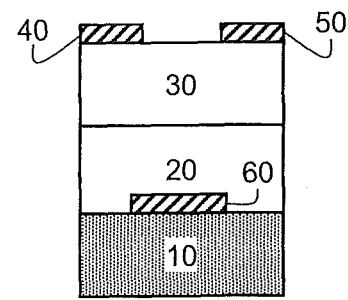
FIG. 1a  FIG. 1b
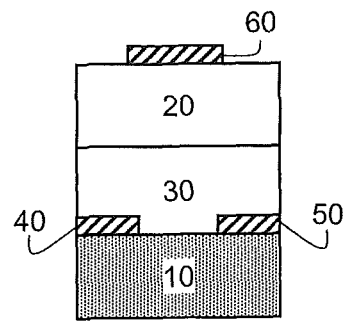
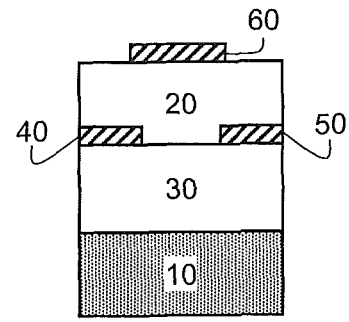
FIG. 1c  FIG. 1d

SEMICONDUCTOR DEVICES AND METHODS OF PREPARATION

FIELD OF THE INVENTION

This invention relates to organic field effect transistors (OFET) having improved performance. More particularly, the invention relates to organic field effect transistors having a polymeric gate dielectric and methods of making such transistors. The polymeric gate dielectric is prepared using a specific organic film-forming polymer and composition containing this organic film-forming polymer.

BACKGROUND OF THE INVENTION

A typical field effect transistor (FET) comprises a number of layers and they can be configured in various ways. For example, an FET may comprise a substrate, a dielectric, a semiconductor, source and drain electrodes connected to the semiconductor and a gate electrode. When voltage is applied between the gate and source electrodes, charge carriers are accumulated in the semiconductor layer at its interface with the dielectric resulting in the formation of a conductive channel between the source and the drain and current flows between the source and the drain electrode upon application of potential to the drain electrode.

FET's are widely used as a switching element in electronics, for example, in active-matrix liquid-crystal displays, smart cards, and a variety of other electronic devices and components thereof. The thin film transistor (TFT) is an example of a field effect transistor (FET). The best-known example of an FET is the MOSFET (Metal-Oxide-Semiconductor-FET), today's conventional switching element for high-speed applications. Presently, most thin film devices are made using amorphous silicon as the semiconductor. Amorphous silicon is a less expensive alternative to crystalline silicon. This fact is especially important for reducing the cost of transistors in large-area applications. Application of amorphous silicon is limited to low speed devices, however, since its maximum mobility (0.5-1.0 $cm^2/V \cdot sec$) is about a thousand times smaller than that of crystalline silicon.

Although amorphous silicon is less expensive than highly crystalline silicon for use in TFT's, amorphous silicon still has its drawbacks. The deposition of amorphous silicon, during the manufacture of transistors, requires relatively costly processes, such as plasma enhanced chemical vapor deposition and high temperatures (about 360° C.) to achieve the electrical characteristics sufficient for display applications. Such high processing temperatures disallow the use of substrates, for deposition, made of certain plastics that might otherwise be desirable for use in applications such as flexible displays.

In the past two decades, organic materials have received significant attention as a potential alternative to inorganic materials, such as amorphous silicon, for use in semiconductor channels of FET's. Compared to inorganic materials, that require a high-temperature vacuum process, organic semiconductor materials are simpler to process, especially those that are soluble in organic solvents and, therefore, capable of being applied to large areas by far less expensive processes, such as roll-to-roll coating, spin coating, dip coating and microcontact printing. Furthermore organic materials may be deposited at lower temperatures, opening up a wider range of substrate materials, including plastics, for flexible electronic devices. Accordingly, thin film transistors made of organic materials can be viewed as a potential key technology for plastic circuitry in display drivers, portable computers, pagers, memory elements in transaction cards, and identification tags, where ease of fabrication, mechanical flexibility, and/or moderate operating temperatures are important considerations. However, to realize these goals, OFET semiconductor and dielectric components should ideally be easily manufactured using high-throughput, atmospheric pressure, solution-processing methods such as spin-coating, casting, or printing.

To date in the development of organic field effect transistors (OFET's) considerable efforts have been made to discover new organic semiconductor materials and optimizing properties of such materials. These efforts have been quite fruitful and a number of organic semiconducting materials have been designed and, to a lesser extent, structure-property relationships of such materials have been studied.

Accordingly, fused acenes such as tetracene and pentacene, oligomeric materials containing thiophene or fluorene units, and polymeric materials like regioregular poly(3-alkylthiophene) have been shown to perform in OFET's as "p-type" or "p-channel," semiconductors—meaning that negative gate voltages, relative to the source voltage, are applied to induce positive charges (holes) in the channel region of the device. Examples of acene and heteroacenes based semiconductors are well known in the prior art.

As an alternative to p-type organic semiconductor materials, n-type organic semiconductor materials can be used in FET's where the terminology "n-type" or "n-channel" indicates that positive gate voltages, relative to the source voltage, are applied to induce negative charges in the channel region of the device. For examples, n-type semiconductors based on diimide materials are known in the art.

The overall performance of an OFET is dependent on a number of factors such as the degree of crystallization and the order of organic semiconductor layers, charge characteristics, and trap density at the interfaces between dielectric and organic semiconductor layers, carrier injection ability of the interfaces between source/drain electrodes and organic semiconductor layers. Although the gate dielectric layer is intended to ensure a sufficiently good electrical insulation between the semiconductor and the gate electrode, it serves an important role in the overall performance of an OFET. In particular, the gate dielectric permits the creation of the gate field and the establishment of the two-dimensional channel charge sheet. Upon application of a source-drain bias, the accumulated charges move very close to the dielectric-semiconductor interface from the source electrode to the drain electrode.

Since the charge flow in an organic semiconductor occurs very close (~1 nm) to the dielectric interface, it is important to optimize chemical and electrical behavior of the dielectric layer. Besides these factors, the dielectric surface morphology has a great effect on carrier or charge mobility of the semiconductor. The surface morphology of the dielectric material and variations in its surface energies [for example, surface treatment using self-assembled monolayers (SAM's)] have been shown to modify the growth, morphology, and microstructure of the vapor/solution-deposited semiconductor, each of these factors affecting mobility and the current on/off ratio, the latter being the drain-source current ratio between the "on" and "off" states, which is another important FET device parameter. The properties of the dielectric material can also affect the density of state distribution for both amorphous and single-crystal semiconductors.

Known materials used as gate dielectrics in OFET's include both inorganic and organic materials. Inorganic dielectric materials such as silicon oxide ($SiO_2$), silicon nitride ($SiN_x$), aluminum oxide ($AlO_x$), and tantalum oxide ($TaO_x$) are usually deposited using chemical vapor deposition (CVD) and plasma enhanced CVD methods that are high temperatures (>300° C.) processes and not compatible with polymeric substrates. Lower processing temperatures usually lead to poor quality films with pinholes, resulting in poor insulating properties. As a result, it is necessary to use thick layers (more than 100 nm) to ensure sufficient insulator properties that result in increased supply voltages for the operation of such circuits. Another widely used process is ion beam deposition, but it requires high vacuum and expensive equipment that are incompatible with the goal of very low cost production. Similarly, the use of other high dielectric constant inorganic materials such as barium zirconate titanate (BZT) and barium strontium titanate (BST) need either a high firing temperature (400° C.) for the sol-gel process, or radiofrequency magnetron sputtering, which also requires vacuum equipment, and can also have stoichiometric problems.

In addition to higher temperature processing, the inorganic insulating layers generally require interfacial modification before they can be used with organic semiconductor. It has been shown that the presence of polar functionalities (like hydroxy groups on a $SiO_2$ surface) at the dielectric-organic semiconductor interface trap charges, which results in lowers carrier mobility in organic semiconductors. This is especially true for n-type organic semiconductors and OFET devices comprising n-type semiconductors. For example, a silicon dioxide dielectric surface is commonly functionalized with long alkyl chain silanes [commonly octadodecyl trichlorosilane (OTS)] using a solution phase self assembly process. This results in a low energy dielectric surface with very few chemical defects or reactive functionalities that could adversely affect the OFET device performance.

Most organic materials used in OFET's cannot withstand the high processing temperatures used with known inorganic materials. For example, the 200+° C. temperatures needed to process conventional inorganic materials would at the very least cause a polymeric substrate to deform, and might cause further breakdown of the polymer or even ignition at high enough temperatures. Deformation is highly undesirable, since each layer of the structure has to be carefully registered with the layers below it, which becomes difficult or impossible when the layers below it are deformed due to processing temperatures.

As an alternative to inorganic gate dielectrics, it has been proposed to use insulating polymers for fabrication of OFET's. Polymers generally have the advantage that they can be processed at relatively low temperatures of below approximately 200° C. However, compared to inorganic dielectrics, the insulating property of thin layers of polymeric dielectrics is usually poor on account of leakage currents. Hence, comparatively thick layers (more than 100 nm) of polymeric dielectrics are usually employed in fabrication of OFET's. As a consequence, integrated circuits having OFET's with polymeric gate dielectrics require the use of comparatively high supply voltages. In pentacene layers deposited on polymeric dielectrics, the mobility of the charge carriers is similar or higher in comparison with inorganic dielectrics.

A number of polymers have been used as gate dielectrics in OFET's. Halik et al. (Journal of Applied Physics 93, 2977 (2003)) describe the use of poly(vinyl phenol) (PVP) that is thermally cross-linked with polymelamine-co-formaldehyde as a gate dielectric layer to make p-type OFET's. However, this attempt is limited since a high temperature of about 200° C. is required to attain crosslinking. Similarly, U.S. Patent Application Publication 2010-0084636 (Lin et al.) describes a photosensitive dielectric material comprising a poly(vinyl phenol) based polymer, a crosslinking agent, and a photoacid generator. However, the presence of acid is not desirable since it could have deleterious effect on the performance of OFET's.

U.S. Pat. No. 7,298,023 (Guillet et al.) describes the use of organic insulator (or dielectric) comprising a base copolymer of PVDC-PAN-PMMA having the general formula $(-CH_2Cl_2-)_x-(-CH_2CH(CN)-)_y-(CH_2C(CH_3)(CO_2CH_3))_z$, wherein x, y, z, in each case (independently from one another) may assume values between 0 and 1, for use in OFET's and organic capacitors. However, the presence of polar groups at the dielectric interface creates dipolar disorder that lowers the carrier mobility.

U.S. Patent Application Publication 2008-0283829 (Kim et al.) discloses an organic insulator composition comprising a crosslinking agent and a hydroxyl group-containing oligomer or hydroxyl group-containing polymer. However, the presence of hydroxyl groups at the organic semiconductor gate dielectric interface is not desirable as hydroxyl trap charges.

U.S. Pat. No. 6,232,157 (Dodabalapur et al.) discloses the use of a polyimide as material for organic insulating films. U.S. Pat. No. 7,482,625 (Kim et al.) discloses a thermosetting composition for organic polymeric gate insulating layer in OFET's. U.S. Pat. No. 7,482,625 also describes blending polyvinyl phenol with another polymer in consideration of physical, chemical, and electrical characteristics. The polymers that can be blended include polyacrylates, poly(vinyl alcohol), polyepoxys, polystyrene, and poly(vinyl pyrrolidone). U.S. Pat. No. 7,741,635 (Kim et al.) describes photo-crosslinkable polymer dielectric composition comprising an insulating organic polymer such as poly(methyl methacrylate) (PMMA), poly(vinyl alcohol) (PVA), poly(vinyl pyrrolidone) (PVP), or poly(vinyl phenol) (PVPh) and a copolymer thereof, a crosslinking monomer having two or more double bonds, and a photoinitiator. U.S. Patent Application Publication 2008-0161464 (Marks et al.) discloses a crosslinked polymeric composition as gate dielectric material.

EP 1,679,754A1 (Kim et al.) describes coating a surface of a crosslinked poly(vinyl phenol) gate dielectric with a thin film of fluorine containing polymer. Although OFET device performance may improve in the presence of fluorine containing polymer, the process requires undesirably coating multiple polymer layers. U.S. Pat. No. 7,352,038 (Kelley et al.) describes an OFET comprising a substantially nonfluorinated polymeric layer interposed between a gate dielectric and an organic semiconductor layer.

U.S. Pat. No. 7,528,448 (Bailey et al.) describes a multi-layer thermal imaging dielectric donor composition of a dielectric layer comprising one or more dielectric polymers such as acrylic and styrenic polymers and heteroatom-substituted styrenic polymers.

WO2007-129832 (Lee et al.) describes a composition for forming a gate insulating layer of an OFET comprising an acrylate polymer and show mobilities in the range of 0.19-0.25 $cm^2/V·sec$, which are significantly lower than those reported for poly(methyl methacrylate) dielectrics.

While a number of dielectric compositions and materials have been proposed for uses in OFET devices, polymer dielectric materials that work well in p-type or p-channel OFET's usually do not necessarily perform as well with OFET's comprising n-type semiconductors. It has been proposed that the presence of reactive chemical functionalities and dipoles at the semiconductor-polymer dielectric interface have much more significant effect on n-type semiconductors than p-type semiconductors. U.S. Pat. No. 7,638,793 (Chua et al.) describes that for an n-channel or ambipolar OFET the organic gate dielectric layer forming an interface with the semiconductive layer; should have less than $10^{18}$ cm$^{-3}$ bulk concentration of trapping groups, and the use of poly(siloxanes) (for example Cyclotene® polymer), poly(alkenes), and poly(oxyalkylenes) as dielectric materials.

Although various polymer dielectric compositions are known, a number of problems still remain in terms of the process of making such dielectric layers and improving overall performance in OFET's. As discussed before, some the polymer dielectric compositions require coating of multiple layers that is a difficult and costly process. Other examples of dielectric compositions include thermosetting polymers comprising poly(vinyl phenol) as the main component and require a high temperature annealing and crosslinking process. It is difficult to crosslink all phenolic groups during thermal annealing and thus the presence of phenolic groups in dielectric is not desirable.

There are very few polymeric dielectric materials that perform equally well with both hole-transporting (p-type) and electron-transporting (n-type) organic semiconductors. Thus, there is a need for polymer dielectric materials that are soluble in environmentally friendly solvents, easy to apply as a single layer, that exhibit good electrical and insulating properties, and that can be prepared from commercially available polymer or molecular precursors using solution processes at low temperatures and atmospheric pressures. It is also desired that they would be compatible with both p-type and n-type semiconductors, adhere well to various substrates, and be resistant to the absorption of ambient moisture. It is difficult to find polymeric materials that have all of these properties because some polymers will exhibit improvements in some of the properties but exhibit worse effects in others.

With the difficulty in balancing all desired properties in mind, there continues to be research to find useful polymeric dielectric materials.

SUMMARY OF THE INVENTION

The present invention provides a device comprising an organic semiconductor layer and a single dielectric layer in physical contact with the organic semiconductor layer, the single dielectric layer consisting essentially of an organic film-forming polymer that has a glass transition temperature ($T_g$) of at least 70° C. and a number average molecular weight ($M_w$) of at least 20,000, the organic film-forming polymer comprising a backbone comprising at least 0.5 mol % and up to and including 25 mol % of recurring units represented by the following Structure (A), based on total organic film-forming polymer recurring units:

(A)

wherein X is an organic backbone unit, n is 0 or 1, G is a substituted or unsubstituted divalent organic linking group other than oxyarylene, $R^1$ is a substituted or unsubstituted aliphatic group comprising at least 6 carbon atoms.

In some embodiments of the device of this invention, the organic film-forming polymer has a glass transition temperature ($T_g$) of at least 70° C. and up to and including 250° C., and the organic film-forming polymer comprises at least 5 mol % and up to and including 20 mol % of recurring units represented by Structure (A) noted above, and at least 80 mol % and up to and including 95 mol % of recurring units represented by the following Structure (B), based on total organic film-forming polymer recurring units:

(B)

wherein X and X' represent the same or different organic backbone unit, G and G' are each a carbonyloxy group, m and n are independently 0 or 1, $R^1$ is a monovalent hydrocarbon group having 12 to 40 carbon atoms, and $R^2$ is a substituted or unsubstituted hydrocarbon having 1 to 40 carbon atoms, the recurring units represented by Structure (A) are different than the recurring units represented by Structure (B), as described below, particularly when $R^1$ and $R^2$ are different groups.

This invention also provides a composition for an organic polymer dielectric layer comprising a solvent and the organic film-forming polymer that has a glass transition temperature ($T_g$) of at least 70° C. and comprises a backbone comprising at least 0.5 mol % and up to and including 25 mol % of the recurring units identified by the Structure (A) described herein.

Further, this invention provides novel organic film-forming polymers, each that has a glass transition temperature ($T_g$) of at least 70° C. and comprises a backbone comprising at least 0.5 mol % and up to and including 25 mol % of the recurring units identified by the following Structure (A), based on total organic film-forming polymer recurring units:

(A)

wherein X is an organic backbone unit, n is 0 or 1, G is a substituted or unsubstituted divalent organic linking group other than oxyarylene, $R^1$ is a substituted or unsubstituted aliphatic group comprising at least 6 carbon atoms.

In addition, the present invention provides a method for preparing an electronic device comprising:

independently applying a dielectric composition and an organic semiconductor composition to a substrate so that, when dried, the applied dielectric composition forms a single dielectric layer that is in physical contact with the applied organic semiconductor composition, wherein the dielectric composition comprises an organic film-forming polymer that has a glass transition temperature ($T_g$) of at least 70° C. and comprises a backbone comprising at least 0.5 mol % and up to and including 25 mol % of the recurring units identified by the following Structure (A), based on total organic film-forming polymer recurring units:

(A)

wherein X is an organic backbone unit, n is 0 or 1, G is a substituted or unsubstituted divalent organic linking group other than oxyarylene, $R^1$ is a substituted or unsubstituted aliphatic group comprising at least 6 carbon atoms.

This method can also comprise:

applying the dielectric composition to the substrate that is electrically conducting to form a gate dielectric layer, removing the solvent from the coated gate dielectric layer to dry it, applying the organic semiconductor composition to the gate dielectric layer to form an organic semiconductor layer, and forming one or more sets of electrically conductive source and drain electrodes on the organic semiconductor layer.

Further, a process for fabricating a thin-film semiconductor device, comprises:

providing a substrate, providing a gate electrode material over the substrate, providing an organic film-forming polymer dielectric gate layer over the gate electrode material, depositing a thin film of an organic semiconductor material, and providing a source electrode and a drain electrode contiguous to the thin-film of the organic semiconductor material, wherein the organic film-forming polymer dielectric gate layer comprises an organic film-forming polymer that has a $T_g$ of at least 70° C. and comprises a backbone comprising at least 0.5 mol % and up to and including 25 mol % of the recurring units identified by the following Structure (A), based on total organic film-forming polymer recurring units:

(A)

wherein X is an organic backbone unit, n is 0 or 1, G is a substituted or unsubstituted divalent organic linking group other than oxyarylene, $R^1$ is a substituted or unsubstituted aliphatic group comprising at least 6 carbon atoms.

The present invention provides organic film-forming polymeric dielectric materials, related compositions, and associated semiconductor devices that address various deficiencies and shortcomings in organic polymers used as dielectric layers known in the art. The present invention provides materials and methods for improving the properties of organic field effect transistors (OFET's) including n-type or p-type organic field effect thin film transistors, using improved organic film-forming polymeric dielectric materials. The resulting devices of this invention can be readily manufactured using low-cost processes.

In some embodiments, the present invention provides an organic polymeric dielectric material for use in organic electronic components such as the OFET's as well as a capacitor. The method of this invention provides a way to make an OFET by providing a substrate, forming a gate electrode on the substrate, forming a gate dielectric on the gate electrode using the inventive organic film-forming polymer in a dielectric layer (for example, having a thickness less than 1 μm) interposed between the gate electrode and an organic semiconductor layer, depositing an organic semiconductor layer adjacent to the polymeric layer, and depositing a source electrode and a drain electrode contiguous to the organic semiconductor layer on the substrate.

These advantages are provided by the unique polymers of this invention that have a glass transition temperature ($T_g$) of at least 70° C. and comprise a backbone comprising at least 0.5 mol % and up to and including 25 mol % of the recurring units identified by Structure (A). For example, the long side chains in the Structure (A) recurring units provide improved carrier mobility and on/off ratios in OFET devices.

BRIEF DESCRIPTION OF THE DRAWINGS

FIGS. 1a through 1d illustrate cross-sectional views of four possible configurations for an organic field effect transistor that is one embodiment of the present invention. FIGS. 1a and 1b have a bottom gate configuration and FIGS. 1c and 1d have a top gate configuration.

DETAILED DESCRIPTION OF THE INVENTION

Definitions

Figure 2:
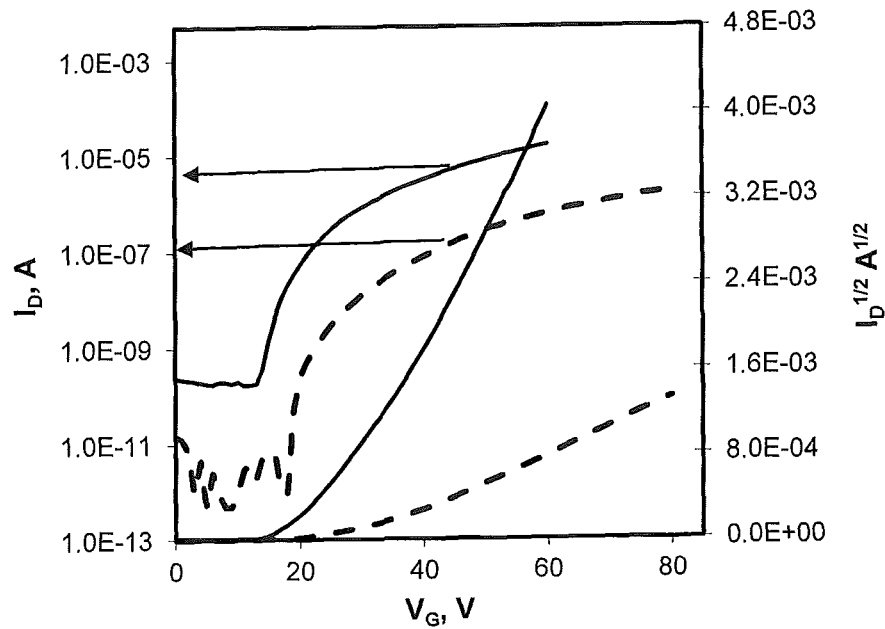
FIG. 2 is a graphical plot of $(I_d)^{1/2}$ versus $V_G$ plot as described below in Invention Examples 6 and Comparative Example 3.

As used herein to define various components of the devices, compositions, and layers, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term's definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

As used herein, the terms "over," "above," and "under" and other similar terms, with respect to layers in the devices of this invention, refer to the order of the layers, wherein the organic thin film layer is above the gate electrode, but do not necessarily indicate that the layers are immediately adjacent or that there are no intermediate layers.

Moreover, unless otherwise indicated, percentages refer to percents by total dry weight, for example, weight % based on total solids of either a layer or formulation used to make a layers. Unless otherwise indicated, the percentages can be the same for either the dry layer or the total solids of the formulation used to make that layer.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

The term "polymer" refers to high and low molecular weight polymers including oligomers and includes homopolymers and copolymers. The term "copolymer" refers to polymers that are derived from two or more different monomers.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

The above described features and advantages of the present invention will become more apparent when taken in conjunction with the following description and drawings wherein identical reference numerals have been used, where possible, to designate identical or analogous features that are common to the figures.

Organic Film-Forming Polymers

The organic film-forming polymers of this invention can be vinyl polymers formed using emulsion or solution polymerization techniques and one or more ethylenically unsaturated polymerizable monomers as starting materials, or they can be condensation polymers such as polyesters, polyamides, polycarbonates, polyurethanes, polyimides, polyketones, polysulfones, polyetherketones, or polyalkylenoxides that are formed using the appropriate synthetic methods known in the art. The vinyl polymers are particularly useful and most of the discussion relating to polymer properties and synthetic methods are directed to those polymers but that it is not intended to limit the scope of the invention to vinyl polymers. Mixtures of the same or different types of organic film-forming polymers can be used in the dielectric layers of the devices of this invention.

The organic film-forming polymers of this invention can therefore be formed using various polymerization techniques that are well known in the art once the starting materials and a particular Structure (A) recurring unit are chosen.

Each of the organic film-forming polymers of this invention, which can be used in the compositions and devices of this invention, generally has a glass transition temperature ($T_g$), as determined by Differential Scanning Calorimetry (DSC), of at least 70° C. or typically at least 70° C. and up to and including 250° C.

The organic film-forming polymers useful in this invention generally have a weight average molecular weight ($M_w$) of at least 20,000 and up to and including 2,000,000, and typically of at least 50,000 and up to and including 500,000. $M_n$ can be determined using known procedures such as by gel permeation chromatography (polystyrene standards).

Each of the organic film-forming polymers comprises a backbone comprising at least 0.5 mol % and up to and including 25 mol %, and typically at least 5 mol % and up to and including 20 mol % of Structure (A) recurring units as described below, in random order, based on the total moles of recurring units in the polymer backbone. The Structure (A) recurring units need not be the same throughout the polymer backbone. Thus, multiple different recurring units represented by Structure (A) can be present along the backbone of a particular organic film-forming polymer.

The Structure (A) recurring units in the organic film-forming polymers are as follows:

wherein X represents the organic backbone unit, for example, a carbon-carbon single bond unit that can be unsubstituted or further substituted with one or more halo atoms or alkyl groups having 1 to 3 carbon atoms. In addition, X can represent the repeating unit of a polyester, polyamide, polyurethane, polyimide, polyaryleneoxide, polysulfone, polyether, polyetherketone, or vinyl polymer.

In Structure (A), n is 0 or 1, and in many embodiments of vinyl polymers, n is 1.

G is a substituted or unsubstituted divalent organic linking group that can have least one oxygen, sulfur, or nitrogen heteroatom in the organic linking group chain. For example, useful G groups include but are not limited to, carbonyloxy [—C(=O)—O—], sulfonyloxy [—SO$_2$—O—], oxy (—O—), dioxy (—O—O—) thio (—S—), dithio (—S—S—), seleno (—Se—), sulfinyl (—SO—), sulfonyl (—SO$_2$—), carbonamido [—C(=O)—NH—], sulfonamide [—SO$_2$—NH—], substituted or unsubstituted arylene (such as substituted or unsubstituted phenylene), substituted or unsubstituted cycloalkylene having 5 to 8 carbon atoms in the chain (such as pentylene, 1,3-hexylene, 1,4-hexylene, and 3-methyl-1,4-hexylene), imido (—NH—), vinylene-carbonyloxy [—CR=CR'—C(=O)—O—] wherein R and R' are independent hydrogen, methyl, or ethyl, acetylimino [CH$_3$C(=O)—N<], alkylenecarbonyloxy [for example, —CH=CH—CH$_2$—C(=O)—O—], alkyleneimino (for example, —CH$_2$—NH—), alkylenecarbonyloxy [for example, —CH$_2$—C(=O)—O—], benzylene, carbonyldioxy [—O—C(=O)—O—], diazo[—N=N—], and ureylene [—NH—C(=O)—NH—]. Combinations of two or more of these listed groups can be used to form a G divalent linking except that oxyarylene groups are excluded. Where chemical, any of these groups can be substituted as long as the organic film-forming polymer properties are not adversely affected. The carbonyloxy and substituted or unsubstituted phenylene groups are particularly useful. For any of these groups that can be substituted, suitable substituents include but are not limited to alkyl groups, alkoxy groups, hydroxy groups, carboxy groups, sulfo groups, halo groups, and other substituents, and a skilled worker would know which substituents would be possible so that the dielectric properties of the organic film-forming polymer are not adversely affected.

In some embodiments of Structure (A) recurring units, n is 0 or 1 and when n is 1, G is a carbonyloxy group, amide group, substituted or unsubstituted phenylene group, oxy group, or thio group.

In Structure (A), R$^1$ is a substituted or unsubstituted aliphatic group having at least 6 carbon atoms including but not limited to, substituted or unsubstituted, and linear or cyclic monovalent hydrocarbons. Useful monovalent hydrocarbon groups can be saturated or unsaturated but saturated hydrocarbon groups are particularly useful. In addition, the useful R$^1$ monovalent hydrocarbon groups can have at least 12 carbon atoms and up to and including 40 carbon atoms, or typically at least 18 carbon atoms and up to and including 30 carbon atoms in the linear or cyclic group. Linear long-chain alkyl groups having at least 12 carbon atoms and up to and including 30 carbon atoms in the chain, are particularly useful.

Some particularly useful ethylenically unsaturated polymerizable monomers that can be used to provide recurring units that are represented by Structure (A) and that can be used to prepare organic film-forming polymers of this invention include but are not limited to, hexyl methacrylate, heptyl methacrylate, octyl methacrylate, octadecyl methacrylate, decyl methacrylate, hexadecyl methacrylate, dodecyl methacrylate, cyclohexyl methacrylate, cyclooctyl methacrylate, 4-octylphenyl methacrylate, docosonyl methacrylate, 2-octyl-1-dodecanyl methacrylate, 4-octylcycloheyxl methacrylate, 2-ethylhexyl methacrylate, eicosanyl methacrylate, and corresponding acrylates.

Since the organic film-forming polymers of this invention have only up to 25 mol % of recurring units defined by Structure (A), the remainder of the polymer backbone can have any suitable "additional" recurring units, generally in random order with each other and with the Structure (A) recurring units. These additional recurring units are different than the recurring units defined by Structure (A), in some respect, for example in different linking groups or side chains. In particular, the organic film-forming polymers can have at least 75 mol % and up to 99.5 mol %, or typically at least 80 mol % and up to and including 95 mol %, of these additional recurring units in the backbone, based on the total moles of recurring units in the polymer backbone. Such additional recurring units can be derived, for example, from ethylenically unsaturated polymerizable monomers, which monomers can be substituted or unsubstituted. Thus, polymerizable olefins can be used to provide the additional recurring units.

More generally, useful additional recurring units can be defined as those that, when present as the only recurring units in a homopolymer, this homopolymer should have a glass transition temperature ($T_g$) at least 100° C. and up to any temperature that is a practical limit so that the resulting organic film-forming polymers of this invention have the desired dielectric properties in the devices of this invention. This "homopolymer $T_g$ feature" can be determined using DSC.

The additional recurring units need not be the same throughout the polymer backbone. For example, multiple different recurring units represented by Structure (B) below can be present along the backbone of a particular organic film-forming polymer.

In many embodiments, the additional recurring units can be represented by the following Structure (B):

(B)

wherein X' is an organic backbone unit that is different than the X organic backbone unit, and it will be define primarily by the type of polymer, whether vinyl polymer, condensation polymer, or other type of polymer.

G' is a divalent organic linking group such as those used in the definition of G except that oxyarylene groups are not excluded for G'. The G and G' groups in a given organic film-forming polymer can be the same or different and for example, in many embodiments G and G' are the same divalent organic linking groups. In some embodiments, at least one of G and G' is a carbonyloxy group, and in other embodiments, both G and G' are carbonyloxy groups.

In Structure (B), m is 0 or 1, and in many embodiments, m is 1.

$R^2$ can represent any aliphatic, aromatic, alicyclic, or cyclic group that would be readily apparent to one skilled in the art as long as the "homopolymer" $T_g$ feature described above is met for the given recurring unit, and generally $R^2$ and $R^1$ are different groups. In many embodiments, $R^2$ is a substituted or unsubstituted, linear or branched, hydrocarbon such as linear or cyclic hydrocarbon groups having 1 to 40 carbon atoms including but not limited to alkyl groups, adamantyl and diadamantyl groups, and carbocyclic aromatic groups.

Some particularly useful ethylenically unsaturated polymerizable monomers that can be used to provide recurring units represented by Structure (B) include but not limited to, 1-diadamantyl methacrylate, 1-adamantyl methacrylate, methyl methacrylate, n-butyl methacrylate, t-butyl methacrylate, n-butyl acrylate, phenyl methacrylate, 2-phenylethyl methacrylate, 1-diadamantyl acrylate, 1-adamantyl acrylate, styrene, 4-methylstyrene, norbornyl methacrylate, 4-t-butylstyrene, 2-vinyl naphthalene, 1-vinyl naphthalene, and 4-vinyl biphenyl.

The organic film-forming polymers of this invention can be prepared using conventional free radical polymerization techniques with the appropriate starting materials (for example, ethylenically unsaturated polymerizable monomers) and polymerization initiators. Similarly, living free radical polymerization techniques such as atom transfer radical polymerization (ATRP), nitroxide-mediated polymerization (NMP), or reversible addition-fragmentation chain transfer (RAFT) polymerization can be used. Representative synthetic preparations are provided below in Invention Examples 1-4. Other organic film-forming polymers of this invention can be prepared using condensation polymerization techniques with the appropriate starting materials (for example diols and diacids for polyesters). A skilled worker in polymer chemistry would be able to use the description in this application including the particular preparations shown in the Invention Examples as guidance to prepare any of the organic film-forming polymers within the scope of this invention, and to use them in the compositions and devices described herein.

As noted above, some of the polymers of this invention are polyesters that are prepared using condensation polymerization techniques. A representative inventive example is shown in Inventive Example 11 below.

For example, the following compound can be used in condensation reactions to prepare a polyester within the present invention:

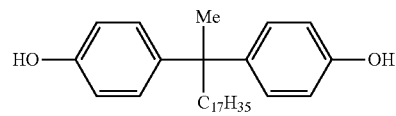

that provides the following recurring unit:

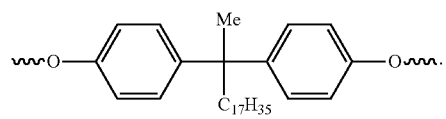

For example, a polyester within the scope of the present invention is represented by the following structure:

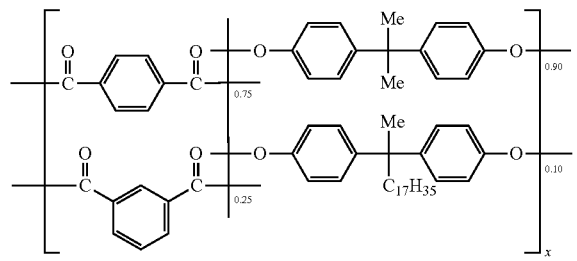

wherein x represents any number that is desired as long as molecular weight and glass transition temperature are as desired.

A polyester that is outside the present invention is represented by the following structure:

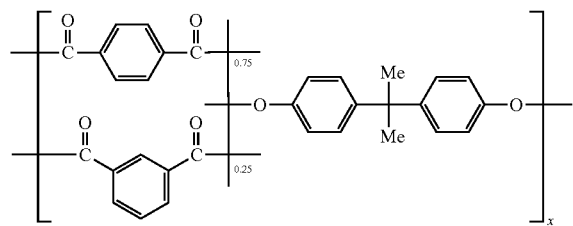

wherein x is as noted above.

The organic film-forming polymers of this invention can be provided as solutions in solvents such as toluene, chloroform, 1,2,3-trichloropropane, chlorobenzene, tetrahydrofuran, anisole, N-methyl formamide, N-methylpyrrolidone, ethyl acetate, propylene glycol methyl ether acetate, acetone, 2-butanone, cyclopentanone, cyclohexanone, butyrolactone, acetonitrile, or benzonitrile, or mixtures thereof, as coating compositions.

While these novel organic film-forming polymers and compositions are useful to prepare dielectric layers in various devices described herein, this disclosure is not meant to be limiting as to the uses since such organic film-forming polymers can have in other applications, technologies, or industries.

Electronic Devices

Each organic field effect transistor (OFET) in the embodiments of FIGS. 1a-1d contains source electrode 40, drain electrode 50, gate electrode 60, gate dielectric 20, substrate 10, and semiconductor organic layer 30 in the form of a film connecting source electrode 40 to drain electrode 50, which organic semiconductor layer comprises a compound as described below. When the OFET operates in an accumulation mode, the charges injected from source electrode 40 into the organic semiconductor layer 30 are mobile and a current flows from source 40 to drain 50, mainly in a thin channel region within about 100 Angstroms of the semiconductor-dielectric interface. In the configuration of FIG. 1a, the charge need only be injected laterally from source electrode 40 to form the channel. In the configuration of FIG. 1b, the charge is injected vertically for source electrode 40 into organic semiconductor layer 30 to form the channel. In the absence of a gate field, the channel ideally has few charge carriers and as a result there is ideally no source-drain conduction. The off current is defined as the current flowing between source electrode 40 and drain electrode 50 when charge has not been intentionally injected into the channel by the application of a gate voltage. For an accumulation-mode TFT, this occurs for a gate-source voltage more negative, assuming an n-channel, than a certain voltage known as the threshold voltage. The "on" current is defined as the current flowing between source electrode 40 and drain electrode 50 when charge carriers have been accumulated intentionally in the channel by application of an appropriate voltage to gate electrode 60, and the channel is conducting. For an n-channel accumulation-mode TFT, this occurs at gate-source voltage more positive than the threshold voltage. It is desirable for this threshold voltage to be zero or slightly positive for n-channel operation. Switching between on and off is accomplished by the application and removal of an electric field from gate electrode 60 across gate dielectric 20 to the semiconductor-dielectric interface, effectively charging a capacitor.

In accordance with the present invention, the organic film-forming polymers of this invention can be used to provide dielectric layers (also known as gate dielectrics or gate insulator layers) in the devices described herein, to improve electrical properties, without the need for additional surface treatment or coating another layer on the surface to which the organic film-forming polymers are applied.

For example, a gate dielectric or gate insulator layer can be prepared by:

depositing on or applying to a suitable substrate, a liquid composition of this invention that consists essentially of one or more organic film-forming polymers of this invention and optionally one or more suitable solvents, and removing any solvent from the applied liquid layer to form a solid gate dielectric or gate insulator layer. This process is described in more detail below.

In some embodiments, the devices of this invention include but are not limited to, a liquid crystal display device, a photovoltaic device, an organic light-emitting device, a sensor, a memory device, or an integrated circuit.

The devices of this invention can comprise the polymeric dielectric materials described herein and such devices can be electronic device including but not limited to, organic field effect transistors (OFET's), optical devices such as organic light emitting diodes (OLED's), photodetectors, sensors, logic circuits, memory elements, capacitors, and photovoltaic (PV) cells. Particularly useful electronic devices are OFET's that are described in more detail below. However, just because other devices are not described in detail, it is not contemplated that the present invention is useful only as OFET's. A skilled artisan in the various arts would know how to use the polymeric dielectric materials described herein for those other types of devices.

Thus, the present invention also provides a method for the production of a polymeric dielectric layer and electronic devices incorporating such components. In one embodiment, a suitable substrate is provided and a solution or dispersion of the organic film-forming polymer of the present invention is applied to the substrate and dried, and suitable electrical contacts are made with the layer. The particular method to be used can be determined by the structure of the desired semiconductor component. In the production of an organic field effect transistor, for example, a gate electrode can be first deposited on a flexible substrate, a solution or dispersion of an organic film-forming polymer of this invention can then be applied on it to form a dielectric layer, and then source and drain electrodes and a layer of a suitable semiconductor material can be applied on top of the dielectric layer. The structure of such a transistor and hence the sequence of its production can be varied in the customary manner known to a person skilled in the art. Thus, alternatively in another embodiment, a gate electrode can be formed first, followed by a gate polymer dielectric of the organic film-forming polymer, then the organic semiconductor layer can be formed, and finally the contacts for the source electrode and drain electrode can be formed on the organic semiconducting layer. A third embodiment can have the source and drain electrodes formed first, then the organic semiconductor layer can be formed, followed by forming the dielectric layer, and a gate electrode can be formed on the dielectric layer.

A skilled artisan would recognize that other useful structures can be constructed or intermediate surface modifying layers can be interposed between the above-described components of the thin film transistor. In most embodiments, a field effect transistor comprises the organic film-forming polymer dielectric layer, a gate electrode, a organic semiconductor layer, a source electrode, and a drain electrode, wherein the organic film-forming polymer dielectric layer, the gate electrode, the organic semiconductor layer, the source electrode, and the drain electrode are arranged in any sequence as long as the gate electrode, and the organic semiconductor layer both contact the organic film-forming polymer dielectric layer, and the source electrode and the drain electrode both contact the organic semiconductor layer.

Substrate

A substrate (also known as a support) can be used for supporting the OFET or other device of this invention during manufacturing, testing, or use. A skilled artisan would appreciate that a substrate that is selected for commercial embodiments can be different from a substrate that is selected for testing or screening various embodiments. In other embodiments, a temporary substrate can be detachably adhered or mechanically affixed to another substrate. For example, a flexible polymeric substrate can be adhered to a rigid glass substrate that can be removed.

In some embodiments, the substrate does not provide any necessary electrical function (such as electrical conductivity) for the device such as an organic field effect transistor. This type of support is considered a "non-participating support".

Useful substrate materials include both organic and inorganic materials including but not limited to, inorganic glasses, silicon wafer, ceramic foils, polymeric films, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) [sometimes referred to as poly(ether ether ketone) or PEEK], polynorbornenes, polyphenyleneoxides, poly(ethylene naphthalenedicarboxylate) (PEN), poly(ethylene terephthalate) (PET), poly(phenylene sulfide) (PPS), and fiber-reinforced plastics (FRP).

A flexible substrate can be used in some embodiments to allow for roll processing, which can be a continuous process, and providing economy of scale and manufacturing compared to flat or rigid supports. The flexible substrate can be designed to be wrapped around the circumference of a cylinder of less than 50 cm in diameter, or typically less than 25 cm in diameter, without distorting or breaking, using low force. A flexible substrate can be rolled upon itself.

In some devices of the present invention, a substrate is optional. For example, in a top construction as illustrated in FIG. 1b, when the gate electrode or gate dielectric provides sufficient support for the intended use of the resultant TFT, a substrate is not needed.

Gate Electrode

The gate electrode for the OFET's of this invention can be composed of any useful conductive material. A variety of useful gate materials include but are not limited to, metals, degenerately doped semiconductors, conducting polymers, and printable materials such as carbon ink or a silver-epoxy. For example, the gate electrode can comprise doped silicon, or a metal such as aluminum, chromium, gold, silver, nickel, palladium, platinum, tantalum, or titanium, or mixtures thereof. Conductive polymers also can be used, including but not limited to, polyaniline, polypyrrole, and poly(3,4-ethylenedioxythiophene)/poly(styrene sulfonate) (PEDOT:PSS). In addition, alloys, combinations, and multilayers of these materials can be used in the gate electrode.

In some embodiments of the invention, the same material can provide the gate electrode function and also provide a supporting (substrate) function. For example, doped silicon can function as the gate electrode and the substrate for an OFET.

Gate Dielectric

The gate dielectric is provided on a gate electrode to electrically insulate the gate electrode from the rest of the electronic device (such as an OFET device). The gate dielectric is provided as a separate layer comprising one or more of the organic film-forming polymers of this invention. In most embodiments, the dielectric layer consists essentially of one of more of these organic film-forming polymers. In yet other embodiments, the dielectric layer consists only of the organic film-forming polymers of this invention.

The gate dielectric layers used in this invention exhibit a suitable dielectric constant that is at least 4 at 1 Hz and up to and including 3.3 at 1 kHz, or typically at least 6 at 1 Hz and up to and including 2.5 at 1 kHz. The gate dielectric layer generally has a resistivity of at least $10^{14}$ ohm-cm for OFET devices.

In some embodiments, the organic film-forming polymer gate dielectric of this invention can possess one or more of the following characteristics: coatability out of solution, crosslinkable, photo-patternable, high thermal stability (for example, stable up to a temperature of at least 250° C.), low processing temperatures (for example, less than 150° C., or less than 100° C.), and compatibility with flexible substrates.

Crosslinkable or photo-patternable organic film-forming polymers are particularly useful for gate dielectric layers because they provide flexibility in manufacturing methods, are easily applied in solution, and can allow for high-speed roll-to-roll processing. Organic film-forming polymers of this invention are photo-patternable if they include one or more crosslinking (that is, crosslinkable) groups that can be induced to form a crosslinked network upon exposure to suitable radiation (most commonly, UV radiation). The exposed (crosslinked portion of the organic film-forming polymer) becomes insoluble in certain solvents and the unexposed polymer can be washed away using a developing solvent. This is an example of a negative-acting photo-patternable organic film-forming polymer. It is also possible to photo-pattern an organic film-forming polymer that is initially insoluble in certain solvents and that becomes soluble in UV-exposed areas. This is an example of a positive-acting photo-patternable organic film-forming polymer.

For OFET's for example, the polymeric dielectric layer generally has a dry thickness of at least 3,500 Angstroms (Å) and up to and including 15,000 Angstroms (Å), or typically up to and including 10,000 Å, or at least 5,000 Å. The dry thickness can be determined using known methods such as ellipsometry and profilometry. For embedded capacitors and printed circuit board applications, the dry dielectric layer thickness can include those described above for OFET's, but can also be at least 10 μm or at least 20 μm and up to and including 50 μm.

Source and Drain Electrodes

The source electrode and drain electrode are separated from a gate electrode by the gate dielectric while the organic semiconductor layer can be over or under the source electrode and drain electrode. The source and drain electrodes can be composed of any useful conductive material including but not limited to, those materials described above for the gate electrode, for example, aluminum, barium, calcium, chromium, gold, silver, nickel, palladium, platinum, titanium, polyaniline, PEDOT:PSS, graphene, reduced graphene oxide (r-GO), composites of graphene, composites of reduced graphene oxide, other conducting polymers, composites thereof, alloys thereof, combinations thereof, and multilayers thereof.

The thin film electrodes (for example, gate electrode, source electrode, and drain electrode) can be provided by any useful means such as physical vapor deposition (for example, thermal evaporation, sputtering), microcontact printing, or ink jet printing. The patterning of these electrodes can be accomplished by known methods such as shadow masking, additive photolithography, subtractive photolithography, printing, microcontact printing, and pattern coating.

The organic semiconductor layer can be provided over or under the source and drain electrodes, as described above in reference to the thin film transistor article.

Useful materials that can be formed into n-type or p-type organic semiconductor layers are numerous and described in various publications. For example, useful semiconductor materials can be prepared using poly(3-hexylthiophene) (P3HT) and its derivatives, the tetracarboxylic diimide naphthalene-based compounds described in U.S. Pat. No. 7,422,777 (Shukla et al.), the N,N'-diaryl-substituted 1,4,5,8-naphthalene tetracarboxylic acid diimides having electron withdrawing groups as described in U.S. Pat. No. 7,629,605 (Shukla et al.), N,N'-1,4,5,8-naphthalene tetracarboxylic acid diimides having fluoroalkyl-substituted cycloalkyl groups as described in U.S. Pat. No. 7,649,199 (Shukla et al.), heteropyrenes in p-type semiconductors as described in U.S. Pat. No. 7,781,076 (Shukla et al.), cyclohexyl-substituted naphthalene tetracarboxylic acid diimides as described in U.S. Pat. No. 7,804,087 (Shukla et al.), heterocyclyl-substituted naphthalene tetracarboxylic acid diimides as described in U.S. Pat. No. 7,858,970 (Shukla et al.), and N,N'-arylalkyl-substituted naphthalene-based tetracarboxylic acid diimides as described in U.S. Pat. No. 7,981,719 (Shukla et al.). All of these publications noted in this paragraph are incorporated herein by reference.

The present invention also provides integrated circuits that can comprise a plurality of OFET's prepared according to this invention.

Processing

Organic film-forming polymer dielectric layers of the present invention can be readily processed and are thermally and chemically stable to such an extent that they can be dissolved in hot or cold organic solvents. Such dielectric layer(s) in the gate dielectric can be deposited by spin coating, ink jetting, or blade coating. The entire process of making the thin film transistors or integrated circuits of the present invention can be carried out below a maximum support temperature of generally 450° C. or less, or typically at 250° C. or less, or even at 150° C. or less. The temperature selection generally depends on the substrate and processing parameters chosen for the given device, once a skilled artisan has the knowledge contained herein. These temperatures are well below traditional integrated circuit and semiconductor processing temperatures, which enables the use of any of a variety of relatively inexpensive supports, such as flexible polymeric supports. Thus, the present invention enables the production of relatively inexpensive integrated circuits containing organic thin film transistors (OFET's) with significantly improved performance.

In embodiments where materials of semiconductor layers are soluble in coating solvents, both the organic semiconductor layer and the organic film-forming polymer gate dielectric layer can be deposited from solution, making the coating of large areas less difficult.

In one embodiment, an OFET structure illustrated in FIG. 1a is prepared by spin coating an organic semiconductor layer onto a dielectric layer prepared according to this invention, which has pre-patterned source and drain electrodes. In another embodiment, an OFET structure illustrated in FIG. 1c is prepared by spin coating an organic semiconductor layer onto the substrate with pre-patterned source and drain electrodes. Then, an organic film-forming polymer dielectric layer prepared according to this invention is spin coated onto the organic semiconductor layer followed by the deposition of the gate electrode by vacuum deposition or liquid deposition of a conductive metal or metal dispersion, respectively.

Electronic devices in which OFET's and other devices are useful include, for example, more complex circuits such as shift registers, integrated circuits, logic circuits, smart cards, memory devices, radio-frequency identification tags, backplanes for active matrix displays, active-matrix displays (for example liquid crystal or OLED), solar cells, ring oscillators, and complementary circuits, such as inverter circuits. In an active matrix display, a thin film transistor of the present invention can be used as part of voltage hold circuitry of a pixel of the display. In devices containing OFET's, the OFET's are operatively connected by means known in the art.

For example, a process for fabricating a thin-film semiconductor device, comprises, not necessarily in the following order:

providing a substrate, providing a gate electrode material over the substrate, providing an organic film-forming polymer dielectric gate layer (according to the present invention) over the gate electrode material, depositing a thin film of an organic semiconductor, and providing a source electrode and a drain electrode contiguous to the thin-film of the organic semiconductor.

In some embodiments, the steps are performed in the order listed and the substrate is flexible (as described above).

The present invention provides at least the following embodiments and combinations thereof, but other combinations of features are considered to be within the present invention as a skilled artisan would appreciate from the teaching of this disclosure:

1. An organic film-forming polymer that has a glass transition temperature ($T_g$) of at least 70° C. and comprises a backbone comprising at least 0.5 mol % and up to and including 25 mol % of the recurring units identified by the following Structure (A), based on total organic film-forming polymer recurring units:

(A)

wherein X is an organic backbone unit, n is 0 or 1, G is a substituted or unsubstituted divalent organic linking group other than oxyarylene, $R^1$ is a substituted or unsubstituted aliphatic group comprising at least 6 carbon atoms.

2. A composition for an organic polymer dielectric layer comprising a solvent and the organic film-forming polymer of embodiment 1.

3. A device comprising an organic semiconductor layer and a single dielectric layer in physical contact with the organic semiconductor layer,
the single dielectric layer consisting essentially of the organic film-forming polymer of embodiment 1.

4. Any of embodiments 1 to 3, wherein n is 0 or 1 and when n is 1, G is a carbonyloxy group, amide group, substituted or unsubstituted phenylene group, oxy group, or thio group.

5. Any of embodiments 1 to 4, wherein $R^1$ is a monovalent hydrocarbon group having 12 to 40 carbon atoms.

6. Any of embodiments 1 to 5, wherein $R^1$ is a monovalent saturated long-chain alkyl group having 12 to 30 carbon atoms.

7. Any of embodiments 1 to 6, wherein the organic film-forming polymer backbone further comprises at least 75 mol % of the recurring units identified by the following Structure (B), based on total organic film-forming polymer recurring units:

(B)

wherein X' is an organic backbone unit, m is 0 or 1, G' is a divalent organic linking group, and $R^2$ is an aliphatic, aromatic, alicyclic, or cyclic group such that when the recurring unit represented by Structure (B) is part of a homopolymer, that homopolymer has a glass transition temperature of at least 100° C., and $R^1$ and $R^2$ are different groups.

8. Embodiment 7, wherein $R^2$ is a hydrocarbon having 1 to 40 carbon atoms.

9. Embodiment 7 or 8, wherein G and G' are both carbonyloxy.

10. Any of the devices of embodiments 3 to 9 that is an n-type or p-type organic field effect thin film transistor comprising the organic semiconductor layer and the single dielectric layer.

11. Any of the devices of embodiments 3 to 10 that is a thin film transistor that comprises a gate electrode, the dielectric layer, the organic semiconductor layer, and source and drain electrodes formed on a substrate.

12. Any of the devices of embodiments 3 to 11 wherein the substrate is a glass substrate, silicon wafer, or a polymeric film.

13. Any of the devices of embodiments 3 to 12 that is a liquid crystal display device, a photovoltaic device, an organic light-emitting device, a sensor, a memory device, or an integrated circuit.

14. A method for preparing an electronic device comprising:
independently applying a dielectric composition and an organic semiconductor composition to a substrate so that, when dried, the applied dielectric composition forms a single dielectric layer that is in physical contact with the applied organic semiconductor composition,
wherein the dielectric composition is described in any of embodiments 2 or 4 to 9.

15. The method of embodiment 14 comprising:
applying the dielectric composition to the substrate that is electrically conducting to form a gate dielectric layer,
removing the solvent from the coated gate dielectric layer to dry it,
applying the organic semiconductor composition to the gate dielectric layer to form an organic semiconductor layer, and
forming one or more sets of electrically conductive source and drain electrodes on the organic semiconductor layer.

16. A process for fabricating a thin-film semiconductor device, comprising:
providing a substrate,
providing a gate electrode material over the substrate,
providing an organic film-forming polymer dielectric gate layer over the gate electrode material,
depositing a thin film of an organic semiconductor material, and
providing a source electrode and a drain electrode contiguous to the thin-film of the organic semiconductor material,
wherein the organic film-forming polymer dielectric gate layer comprises the organic film-forming polymer of embodiment 1.

17. The process of embodiment 16 wherein the substrate is a flexible substrate.

The following Examples are provided to illustrate the practice of this invention and are not meant to be limiting in any manner.

Organic film-forming polymers of this invention were prepared by the following synthetic procedure:

Diadamantane was synthesized by the method described by Gund et al. (*Org. Synth.* 1973, 53, 30). 1-Bromodiadamantane was synthesized by the method described by Gund et al. (*Tetrahedron Lett.* 1971, 1583). Diadamantane-1-ol was synthesized according to the method described by Janku et al. (*Z. Chem.* 1981, 21, 325).

Synthesis of 1-diadamantyl methacrylate

A stirred mixture of 1-diadamantane-1-ol (4.4 g, 22 mmol), methacrylic anhydride (8.3 g, 54 mmol), ethyl acetate (25 ml), and few mg of 1-hydroxy-2-methyl-6-tert-butylphenyl-sulfide (inhibitor) under argon was heated in a 75° C. oil bath. Molybdenum dioxydichloride (0.11 g, 0.5 mmol) was added, and the mixture was held at 75° C. for 4 days. An additional 0.13 g (0.6 mmol) of molybdenum dioxydichloride was added, and the reaction was continued for 1 day. Methanol (10 ml) was added, and the mixture held 2 hours at 75° C. and then cooled to room temperature. The reaction mixture was stirred for 1 hour with a slurry of powdered potassium carbonate in 100 ml of dichloromethane, filtered, and concentrated to deposit the crude product as an oil that gradually crystallized. The product was purified by column chromatography (silica gel, heptane/dichloromethane) followed by recrystallization from acetonitrile. The desired product was obtained as a white solid, 2.86 g (49%).

Synthesis of octadecyl 4-vinylbenzoate

A stirred mixture of 2.91 g (20 mmol) of 4-vinylbenzoic acid, 5.84 g (22 mmol) of 1-octadecanol, 0.17 g (1 mmol) of 4-toluenesulfonic acid, and 75 ml of toluene was heated at reflux with water separated azeotropically using a Dean-Stark trap. After 16 hours, the mixture was cooled to ambient temperature and filtered through a short column of basic alumina, eluting with tetrahydrofuran. The filtrate was concentrated to deposit a solid product, which was purified by chromatography on silica gel (a heptane/dichloromethane eluate), followed by recrystallization from acetonitrile. A white solid was obtained, mass 3.98 g (51% yield).

In the following polymer syntheses, the starting mol % of each monomer is noted, based on total moles of monomers, and the final polymer product was analyzed by NMR to determine the actual mol % for each monomer.

Invention Example 1

Copolymerization of 1-diadamantyl methacrylate (92 mol %) and octadecyl methacrylate (8 mol A mixture of 1-diadamantyl methacrylate (1.26 g, 4.6 mmol), octadecyl methacrylate (0.14 g, 0.42 mmol), 2,2'-azobis(2-methylbutyronitrile) (8.9 mg, 0.05 mmol), and chlorobenzene (10 ml) was deaerated by sparging with argon for 5 minutes, and then heated under argon in a 70° C. oil bath for 18 hours. The mixture was cooled to room temperature, and the polymer precipitated into excess methanol. The resulting white powder was collected, washed with methanol, and air-dried. This polymer was re-dissolved in dichloromethane and again precipitated into excess methanol, collected, washed with methanol, and dried in a vacuum oven at 60° C. for 24 hours. The product was obtained as a white powder, 1.06 g (76%).

Analysis by size exclusion chromatography (SEC) indicated an $M_w$ of 34,200 (polystyrene standards). The glass transition temperature of the desired polymer was determined to be 161° C. by differential scanning calorimetry (DSC). By NMR, it was determined that the desired polymer had about 8 mol % of recurring units derived from 1-diadamantyl methacrylate and about 92 mol % of recurring units derived from octadecyl methacrylate, based on total polymer recurring units.

Invention Example 2

Copolymerization of 1-diadamantyl methacrylate (96 mol %) and octadecyl methacrylate (4 mol %)

The procedure of Invention Example 1 was followed using 1-diadamantyl methacrylate (1.33 g, 4.9 mmol), octadecyl methacrylate (0.07 g, 0.21 mmol), 2,2'-azobis(2-methylbutyronitrile) (9.4 mg, 0.05 mmol), and chlorobenzene (10 ml). The product was obtained as a white powder, 1.06 g (76%).

Analysis by size exclusion chromatography (SEC) indicated an $M_w$ of 25,800 (polystyrene standards). The glass transition temperature of the desired polymer was determined to be 195° C. by differential scanning calorimetry (DSC). By NMR, it was determined that the desired polymer had about 4 mol % of recurring units derived from 1-diadamantyl methacrylate and about 96 mol % of recurring units derived from octadecyl methacrylate, based on total polymer recurring units.

Invention Example 3

Copolymerization of methyl methacrylate (98 mol %) and octyl methacrylate (2 mol %)

The procedure of Invention Example 1 was followed using methyl methacrylate (20.0 g, 199.80 mmol), octyl methacrylate (0.80 g, 3.99 mmol), 2,2'-azobis(2-methylbutyronitrile) (335 mg, 2.03 mmol), and chlorobenzene (75 ml). The product was obtained as a white powder, 15.8 g (80%).

Analysis by size exclusion chromatography (SEC) indicated an $M_w$ of 37,900 (polystyrene standards). The glass transition temperature of the desired polymer was determined to be 103° C. by differential scanning calorimetry (DSC). By NMR, it was determined that the desired polymer had 2.5 mol % of recurring units derived from methyl methacrylate and 97.5 mol % of recurring units derived from octyl methacrylate, based on total polymer recurring units.

Invention Example 4

Copolymerization of nethyl methacrylate (98 mol %) and octadecyl methacrylate (2 mol %)

The procedure of Invention Example 1 was followed using methyl methacrylate (20.0 g, 199.80 mmol), octadecyl methacrylate (1.35 g, 3.99 mmol), 2,2'-azobis(2-methylbutyronitrile) (335 mg, 2.03 mmol), and chlorobenzene (75 ml). The desired polymer product was obtained as a white powder, 15.5 g (73%).

Analysis by size exclusion chromatography (SEC) indicated an $M_w$ of 33,900 (polystyrene standards). The glass transition temperature of the desired polymer was determined to be 97° C. by differential scanning calorimetry (DSC). By NMR, it was determined that the desired polymer had 98.4 mol % of recurring units derived from methyl methacrylate and 1.6 mol % of recurring units derived from octadecyl methacrylate, based on total polymer recurring units.

Invention Example 5

Copolymerization of crosslinked methyl methacrylate (87 mol %) and ethylene glycol dimethacrylate (13 mol %)

A mixture of methyl methacrylate (4.00 g, 39.95 mmol), ethylene glycol dimethacrylate (1.19 g, 5.99 mmol), 1,-dodecanethiol (0.89 g/, 4.4 mmol), 2,2'-azobis(2-methylbutyronitrile) (85 mg, 0.52 mmol), and toluene (20 ml) was deaerated by sparging with argon for 5 minutes, and then heated under argon in an 80° C. oil bath for 5 hours. The mixture was cooled to room temperature, and the polymer precipitated into excess cold heptane. The resulting white powder was collected, washed with heptane, and air-dried. The polymer was re-dissolved in dichloromethane and again precipitated into excess heptane, collected, washed with heptane, and dried in a vacuum oven at 60° C. for 24 hours. The desired polymer was obtained as a white powder, 3.20 g (62%).

Analysis by size exclusion chromatography (SEC) indicated an $M_w$ of 259,000 (polystyrene standards). By NMR, it was determined that the desired polymer had 86.5 mol % of recurring units derived from methyl methacrylate and 13.5 mol % of recurring units derived from ethylene glycol dimethacrylate, based on total polymer recurring units.

Comparative Example 1

Homopolymerization of 1-diamantyl methacrylate

The procedure of Invention Example 1 was followed using 1-diamantyl methacrylate (0.96 g, 3.5 mmol), 2,2'-azobis(2-methylbutyronitrile) (6.8 mg, 0.04 mmol), and chlorobenzene (5 ml). The product was obtained as a white powder, 0.79 g (82%). Analysis by size exclusion chromatography (SEC) indicated a weight average molar mass of 29,200 (polystyrene standards). The glass transition temperature was determined to be greater than 250° C. by differential scanning calorimetry (DSC).

Organic Semiconductors:

n-Type organic semiconductors A-1 and A-2 that were used to fabricate OFET devices in comparative and inventive examples have been previously described in U.S. Pat. No. 7,422,777 (Shukla et al.) and U.S. Pat. No. 7,804,087 (Shukla et al.). Compounds A-1 and A-2 were prepared and purified following procedures described in these two patents. p-Type organic semiconductors A-3 was prepared and purified following method been previously disclosed in U.S. Pat. No. 7,781,076 (Shukla et al.).

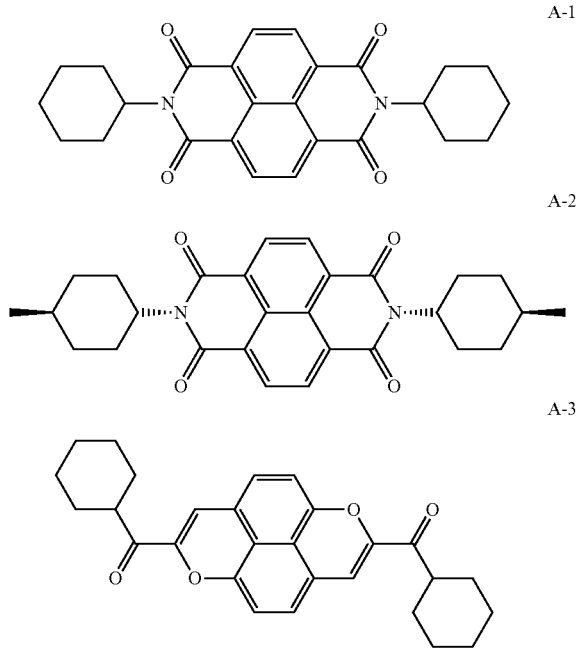

Device Preparation:

In order to test the electrical characteristics of the various organic film-forming polymers, organic field-effect transistors were made using the top-contact geometry as illustrated in FIGS. 1c and 1d. The substrate used was a heavily doped silicon wafer that also served as the gate of each transistor. The gate dielectric layers were polymer layers spun coated onto the substrate having a dry thickness of 300-400 nm.

Preparation of Invention Dielectric Layer:

A solution of an inventive organic film-forming polymer (shown below in the examples, 7-8 weight %$_w$) in anisole was filtered through a Whatman 0.45 μm glass microfiber filter into a clean glass vial or container. A filtered solution of the polymer was spun cast onto a heavily doped silicon wafer substrate for 10 seconds at 2000 rpm and the coating speed was increased over 30 seconds to 4,000 rpm and spun at this speed for 40 seconds. The polymer was then coated doped silicon wafer was then placed on a hot plate and gradually heated from 50° C. to 120° C. over a period of 15 minutes. Finally, the temperature was increased to 150° C. and was held for 30 minutes. Each sample was gradually cooled to room temperature over a period of 30 minutes. The thickness of each organic film-forming polymer layer was in the range of from 300 nm to 380 nm.

Preparation of Organic Semiconductor Layer:

An active layer of naphthalene tetracarboxylic acid diimide based organic semiconductor was deposited using vacuum deposition in a thermal evaporator. The deposition rate was 0.1 Angstroms per second while the substrate temperature was held at 25° C. for most experiments. The thickness of the resulting organic semiconductor layer was a variable in some experiments but was typically 25 nm.

Contacts Deposition

Gold contacts having a thickness of 50 nm were deposited through a shadow mask. The channel width was held at 1000 μm while the channel lengths were varied between 50 μm and 150 μm. Some experiments were performed to look at the effect of other contact materials such as silver.

Device Measurement and Analysis

Electrical characterization of the fabricated devices was performed using a Hewlett Packard HP 4145B® parameter analyzer. The probe measurement station was held in a positive argon environment for all measurements with the exception of those purposely used to test the stability of the devices in air. The measurements were performed under sulfur lighting unless sensitivity to white light was being investigated. The devices were exposed to air prior to testing.

For each experiment performed, between 4 and 12 individual devices were tested using each prepared organic semiconductor layer, and the results were averaged. For each device, the drain current ($I_d$) was measured as a function of source-drain voltage ($V_d$) for various values of gate voltage ($V_g$). For most devices, $V_d$ was swept from 0 V to 80 V for each of the gate voltages measured, typically 0 V, 20 V, 40 V, 60 V, and 80 V. In these measurements, the gate current ($I_g$) was also recorded in order to detect any leakage current through the device. Furthermore, for each device the drain current was measured as a function of gate voltage for various values of source-drain voltage. For most devices, $V_g$ was swept from 0 V to 80 V for each of the drain voltages measured, typically 40 V, 60 V, and 80 V.

Parameters extracted from the data include field-effect mobility (μ), threshold voltage ($V_t$), sub-threshold slope (S), and the ratio of $I_{on}/I_{off}$ for the measured drain current. The field-effect mobility was extracted in the saturation region, where $V_d > V_g - V_t$. In this region, the drain current is given by the equation [see Sze, *Semiconductor Devices—Physics and Technology*, John Wiley & Sons (1981)]:

$$I_d = \frac{WC_0}{2L}\mu(V_g - V_t)^2$$

$$\sqrt{I_d} = \sqrt{\frac{\mu C_0 W}{2L}}(V_g - V_t)$$

$$\text{slope} = \sqrt{\frac{\mu C_0 W}{2L}}$$

$$\mu = (\text{slope})^2 \frac{2L}{C_0 W}$$

wherein W and L are the channel width and length, respectively, and $C_o$ is the capacitance of the dielectric layer, which is a function of oxide thickness and dielectric constant of the material. Given this equation, the saturation field-effect mobility was extracted from a straight-line fit to the linear portion of the $\sqrt{I_d}$ versus $V_g$ curve (as described above). The threshold voltage, $V_t$, is the x-intercept of this straight-line fit. Mobilities can also be extracted from the linear region, where $V_d \leq V_g - V_t$. Here the drain current is given by the following equation (see Sze, noted above):

$$I_d = \frac{W}{L} \mu C_o \left[ V_d(V_g - V_t) - \frac{V_d^2}{2} \right]$$

For these experiments, mobilities in the linear regime were not extracted, since this parameter is very much affected by any injection problems at the contacts. In general, non-linearity in the curves of $I_d$ versus $V_d$ at low $V_d$ indicates that the performance of the device is limited by injection of charge by the contacts. In order to obtain results that are largely independent of contact imperfections of a given device, the saturation mobility rather than the linear mobility was extracted as the characteristic parameter of device performance.

The log of the drain current as a function of gate voltage was plotted. Parameters extracted from the log $I_d$ plot include the $I_{on}/I_{off}$ ratio and the sub-threshold slope (S). The $I_{on}/I_{off}$ ratio is simply the ratio of the maximum to minimum drain current, and S is the inverse of the slope of the $I_d$ curve in the region over which the drain current is increasing (that is, the device is turning on).

The following examples demonstrate that OFET devices comprising organic film-forming polymer gate dielectrics according to the present invention exhibited high mobilities and on/off ratios compared to polymer dielectrics known in the art such as poly(methyl methacrylate). In addition to improved performance, the devices also showed excellent reproducibility.

Comparative Examples 2 and 3 contained Cyclotene® poly(methyl methacrylate) polymer dielectric layers while Invention Examples 6-9 used inventive organic film-forming polymers as polymer dielectric layers.

Comparative Example 2 n-Type OFET Device

Cyclotene® poly(methyl methacrylate) was used as the dielectric layer in an OFET device as described in U.S. Pat. No. 7,638,793 (Chua et al.). A heavily doped silicon wafer was used as the substrate. The wafer was cleaned for 10 minutes in a piranha solution, followed by a 6-minute exposure in a UV/ozone chamber. First, a thin layer of VM651 (from HD MicroSystems) adhesion promoting layer was coated on the Si wafer. This coated layer was annealed at 80° C. for 1-2 hours, and subsequently a solution of 3022-35 (Dow Chemical) (this solution was diluted by adding mesitylene) was spin coated onto a doped silicon wafer at 5000 rpm. This coated silicon wafer was heated under vacuum initially at 150° C. for 5 minutes, then temperature was raised to 200° C. for 15 minutes, and finally the temperature was raised to 270° C. and the coated sample was annealed for additional one hour before being cooled slowly to room temperature. The thickness of the coated Cyclotene® poly(methyl methacrylate) dielectric layer, as determined by ellipsometry, was in the range of 300-350 nm.

The coated wafer was then placed onto a hot plate and gradually heated from 50° C. to 180° C. over a period of 15 minutes. Finally, the temperature was increased to 180° C. and held for 30 minutes. Each sample was gradually cooled to room temperature over a period of 30 minutes. The thickness of the coated dielectric layer was usually in the range of 250-350 nm.

The semiconductor layer of naphthalene tetracarboxylic acid diimide based organic semiconductor A-1 was deposited using vacuum deposition in a thermal evaporator. The deposition rate was 0.1 Angstroms per second while the substrate temperature was held at 25° C. for most experiments. The thickness of the semiconductor layer was a variable in some experiments, but was typically 25 nm. Gold contacts of thickness 50 nm were deposited through a shadow mask. The channel width was held at 650 μm while the channel lengths were varied between 50 μm and 150 μm. Some experiments were performed to look at the effect of other contact materials. A few devices were made with a bottom-contact geometry, in which the contacts were deposited prior to the semiconductor layer. Multiple OFET's were prepared and 4 to 12 representative samples were tested for each deposition run. The electrical parameters of the devices were measured in an argon atmosphere using a Hewlett-Packard 4145B® semiconductor parameter analyzer. For each thin film transistor, the field effect mobility, μ, was calculated from the slope of the $(I_d)^{1/2}$ versus $V_G$ plot. The average mobility was found to be 0.007 cm$^2$/V·sec in the saturation region, the average on-off ratio was $3\times10^3$, and the average threshold voltage was 60 V. Saturation mobilities of up to and including 0.01 cm$^2$/V·sec were measured for these devices. The average results are shown in TABLE I below.

Comparative Example 3 n-Type OFET Device Containing Poly(methyl-methacrylate) (PMMA) as Gate Dielectric A heavily doped silicon wafer was used as the substrate. The wafer was cleaned for 10 minutes in a piranha solution, followed by a 6-minute exposure in a UV/ozone chamber. A 7 weight % solution of PMMA ($M_w$ about 120,000) in anisole was filtered through a Whatman 0.45 μm glass microfiber filter and spun coated on top of the heavily doped Si wafer. The PMMA solution was spun for 10 seconds at 2000 rpm and the spinning speed was increased over 30 seconds to 4000 rpm and spun at this speed for 45 seconds. The coated substrate was then placed on a hot plate and gradually heated from 50° C. to 120° C. over a period of 15 minutes. Finally, the temperature was increased to 150° C. and was held for 30 minutes. Each sample was gradually cooled to room temperature over a period of 30 minutes. The thickness of the PMMA dielectric layer was measured by ellipsometry and found to be in the range of 300-350 nm.

The semiconductor layer of naphthalene tetracarboxylic acid diimide based organic semiconductor A-1 was deposited using vacuum deposition in a thermal evaporator. The deposition rate was 0.1 Angstroms per second while the substrate temperature was held at 25° C. for most experiments. The thickness of the semiconductor layer was a variable in some experiments, but was typically 25 nm. Gold contacts of thickness 50 nm were deposited through a shadow mask. The channel width was held at 650 μm while the channel lengths were varied between 50 μm and 150 μm. Some experiments were performed to look at the effect of other contact materials. A few devices were made with a bottom-contact geometry, in which the contacts were deposited prior to the active material. Multiple OFET's were prepared and 4 to 12 representative samples were tested for each deposition run. The electrical parameters of the devices were measured in an argon atmosphere using a Hewlett-Packard 4145B® semiconductor parameter analyzer. For each thin film transistor, the field effect mobility, μ, was calculated from the slope of the $(I_d)^{1/2}$ versus $V_G$ plot (see dashed curves in FIG. 2). The average mobility was found to be 0.17 cm$^2$/V·sec in the saturation region, the average on-off ratio was $1\times10^6$, and the average threshold voltage was 20 V. Saturation mobilities of up to and including 0.2 cm²/V·sec were measured for these devices. The average results are shown in TABLE I below.

Inventive Example 6 n-Type OFET Device Containing Invention Example 4 Polymer as Gate Dielectric

A heavily doped silicon wafer was used as the substrate. The wafer was cleaned for 10 minutes in a piranha solution, followed by a 6-minute exposure in a UV/ozone chamber. A 7 weight % solution of Invention Example 4 polymer ($M_w$ about 33,900) in anisole was filtered through a Whatman 0.45 micron glass microfiber filter and spin coated on top of the heavily doped Si wafer. The polymer solution was spun for 10 seconds at 2000 rpm and the spinning speed was increased over 30 seconds to 4000 rpm and spun at this speed for 45 seconds. The coated substrate was then placed on a hot plate and gradually heated from 50° C. to 120° C. over a period of 15 minutes. Finally, the temperature was increased to 150° C. and was held for 30 minutes. Each sample was gradually cooled to room temperature over a period of 30 minutes. The thickness of the polymer dielectric layer was measured by ellipsometry and found to be in the range of 300 nm to 350 nm.

The semiconductor layer of naphthalene tetracarboxylic acid diimide based organic semiconductor A-1 was deposited using vacuum deposition in a thermal evaporator. The deposition rate was 0.1 Angstroms per second while the substrate temperature was held at 25° C. for most experiments. The thickness of the semiconductor layer was a variable in some experiments, but was typically 25 nm. Gold contacts of thickness 50 nm were deposited through a shadow mask. The channel width was held at 650 μm, while the channel lengths were varied between 50 μm and 150 μm. Some experiments were performed to look at the effect of other contact materials. A few devices were made with a bottom-contact geometry, in which the contacts were deposited prior to the active material. Multiple OFET's were prepared and 4 to 12 representative samples were tested for each deposition run. The electrical parameters of the devices were measured in an argon atmosphere using a Hewlett-Packard 4145B® semiconductor parameter analyzer. For each thin film transistor, the field effect mobility, μ, was calculated from the slope of the $(I_d)^{1/2}$ versus $V_G$ plot. The average mobility was found to be 0.9 cm²/V·sec in the saturation region, the average on-off ratio was 1×10⁷, and the average threshold voltage was 24 V (see solid curves in FIG. 2). Saturation mobilities of up to and including 1.5 cm²/V·sec were measured for these devices. The average results are shown in TABLE I below.

Inventive Example 7 n-Type OFET Device Containing Invention Example 3 as Gate Dielectric

A heavily doped silicon wafer was used as the substrate. The wafer was cleaned for 10 minutes in a piranha solution, followed by a 6-minute exposure in a UV/ozone chamber. A 7 weight % solution of Invention Example 3 ($M_w$ about 37,900) in anisole was filtered through Whatman 0.45 μm glass microfiber filter, and spin coated on top of the heavily doped Si wafer. The polymer solution was spun for 10 seconds at 2000 rpm and the spinning speed was increased over 30 seconds to 4000 rpm and the polymer was then spun at this speed for 45 seconds. The coated substrate was then placed on a hot plate and gradually heated from 50° C. to 120° C. over a period of 15 minutes. Finally, the temperature was increased to 150° C. and was held for 30 minutes. Each sample was gradually cooled to room temperature over a period of 30 minutes. The thickness of the dielectric layer was measured by ellipsometry and found to be in the range of 300-350 nm.

Figure 3:
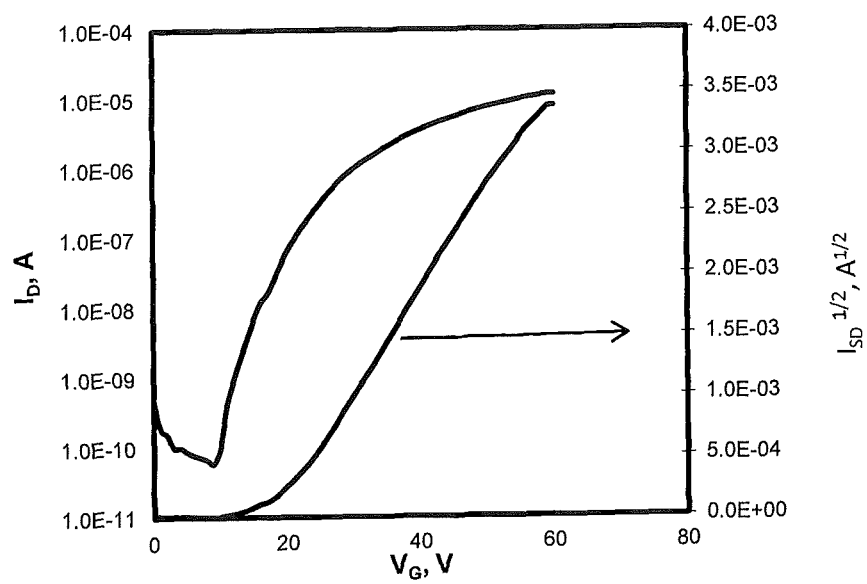
FIG. 3 is a graphical plot of $(I_d)^{1/2}$ versus $V_G$ plot as described below in Invention Example 7.

The semiconductor layer of naphthalene tetracarboxylic acid diimide based organic semiconductor A-1 was deposited via vacuum deposition in a thermal evaporator. The deposition rate was 0.1 Angstroms per second while the substrate temperature was held at 25° C. for most experiments. The thickness of the active layer was a variable in some experiments, but was typically 25 nm. Gold contacts of thickness 50 nm were deposited through a shadow mask. The channel width was held at 650 μm, while the channel lengths were varied between 50 μm and 150 μm. Some experiments were performed to look at the effect of other contact materials. A few devices were made with a bottom-contact geometry, in which the contacts were deposited prior to the active material. Multiple OFET's were prepared and 4 to 12 representative samples were tested for each deposition run. The electrical parameters of the devices were measured in an argon atmosphere using a Hewlett-Packard 4145B® semiconductor parameter analyzer. For each thin film transistor, the field effect mobility, μ, was calculated from the slope of the $(I_d)^{1/2}$ versus $V_G$ plot (see FIG. 3). The average mobility was found to be 0.4 cm²/V·sec in the saturation region, the average on-off ratio was 1×10⁶, and the average threshold voltage was 24 V. Saturation mobilities of up to and including 0.5 cm²/V·sec were measured for these devices. The average results are shown in TABLE I below.

TABLE I

Comparison of Dielectric Layers in OFET Devices.

| | OFET Semi-conductor | $\mu_{avg}$ (cm²/V·s) | $V_t$ (V) | $I_{on}/I_{off}$ |
|---|---|---|---|---|
| Comparative Example-2 | A-1 | 0.016 | 31 | 3 × 10³ |
| Comparative Example-3 | A-1 | 0.17 | 20 | 1 × 10⁶ |
| Inventive Example-6 | A-1 | 0.9 | 24 | 1 × 10⁵ |
| Inventive Example-7 | A-1 | 0.4 | 24 | 1 × 10⁶ |

The data in TABLE I clearly demonstrate the advantage of using the organic film-forming polymers of the present invention as dielectric layers over the use of Cyclotene® poly(methyl methacrylate) that is known from U.S. Pat. No. 7,638,793 (noted above). The overall performance of the OFET devices comprising the organic film-forming polymers of this invention as gate dielectrics is significantly improved as judged by improved mobility, μ, and current on/off ratios.

Inventive Example 8 p-Type OFET Device Preparation Containing Invention Example 3 Polymer as Gate Dielectric This example demonstrates the use of the inventive polymers as dielectric layers in a p-type OFET. A heavily doped silicon wafer was used as the substrate. The wafer was cleaned for 10 minutes in a piranha solution, followed by a 6-minute exposure in a UV/ozone chamber. A 7 weight % solution by weight of the Invention Example 3 polymer (Mw about 33,900) in anisole was filtered through a Whatman 0.45 micron glass microfiber filter, and spin coated on top of the heavily doped Si wafer. The polymer solution was spun for 10 seconds at 2000 rpm and the coating speed was increased over 30 seconds to 4000 rpm and then spun coated at this speed for 45 seconds. The coated substrate was then placed on a hot plate and gradually heated from 50° C. to 120° C. over a period of 15 minutes. Finally, the temperature was increased to 150° C. and was held for 30 minutes. Each sample was gradually cooled to room temperature over a period of 30 minutes. The thickness of the polymer dielectric layer was measured by ellipsometry and was in the range of 300-350 nm.

The semiconductor layer of dioxapyrene A-3 organic semiconductor was deposited using vacuum deposition in a thermal evaporator. The deposition rate was 0.1 Angstroms per second while the substrate temperature was held at 25° C. for most experiments. The thickness of the photoconductor layer was a variable in some experiments, but was typically 25 nm. Gold contacts of thickness 50 μm were deposited through a shadow mask. The channel width was held at 650 μm while the channel lengths were varied between 50 μm and 150 μm. Some experiments were performed to look at the effect of other contact materials. A few devices were made with a bottom-contact geometry, in which the contacts were deposited prior to the active material. Multiple OFET's were prepared and 4 to 12 representative samples were tested for each deposition run. The electrical parameters of the devices were measured in an argon atmosphere using a Hewlett-Packard 4145B® semiconductor parameter analyzer. For each thin film transistor, the field effect mobility, μ, was calculated from the slope of the $(I_d)^{1/2}$ versus $V_G$ plot. The average mobility was found to be 0.016 cm$^2$/V·sec in the saturation region, the average on/off ratio was 1×10$^5$, and the average threshold voltage was 16 V. Saturation mobilities of up to and including 0.05 cm$^2$/V·sec were measured for these devices.

Comparative Example 4 n-Type OFET Having A-2 Semiconductor Layer and PMMA as Gate Dielectric

The PMMA dielectric layer was prepared as described above in Comparative Example 2. The organic semiconductor A-3 was deposited using vacuum deposition in a thermal evaporator. The deposition rate was 0.1 Angstroms per second while the substrate temperature was held at 25° C. for most experiments. The thickness of the semiconductor layer was a variable in some experiments, but was typically 25 nm. Gold contacts of thickness 50 nm were deposited through a shadow mask. The channel width was held at 650 μm while the channel lengths were varied between 50 μm and 150 μm. Multiple OFET's were prepared and 4 to 12 representative samples were tested for each deposition run. The electrical parameters of the devices were measured in an argon atmosphere using a Hewlett-Packard 4145B® semiconductor parameter analyzer. For each thin film transistor, the field effect mobility, μ, was calculated from the slope of the $(I_d)^{1/2}$ versus $V_G$ plot. The average mobility was found to be 1.2 cm$^2$/V·sec in the saturation region, the average on-off ratio was 3×10$^6$, and the average threshold voltage was 19 V. Saturation mobilities of up to and including 1.4 cm$^2$/V·sec were measured for these devices. The average results are shown in TABLE II below.

Inventive Example 9 n-Type OFET Comprising A-2 Semiconductor Layer and Invention Example 3 as Gate Dielectric An Invention Example 3 polymer dielectric layer was prepared as described above. The organic semiconductor A-2 was deposited using vacuum deposition in a thermal evaporator. The deposition rate was 0.1 Angstroms per second while the substrate temperature was held at 25° C. for most experiments. The thickness of the active layer was a variable in some experiments, but was typically 25 nm. Gold contacts of thickness 50 nm were deposited through a shadow mask. The channel width was held at 650 μm while the channel lengths were varied between 50 μm and 150 μm. Some experiments were performed to look at the effect of other contact materials. A few devices were made with a bottom-contact geometry, in which the contacts were deposited prior to the active material. Multiple OFET's were prepared and 4 to 12 representative samples were tested for each deposition run. The electrical parameters of the devices were measured in an argon atmosphere using a Hewlett-Packard 4145B® semiconductor parameter analyzer. For each thin film transistor, the field effect mobility, μ, was calculated from the slope of the $(I_d)^{1/2}$ versus $V_G$ plot. The average mobility was found to be 2.8 cm$^2$/V·sec in the saturation region, the average on-off ratio was 4×10$^7$, and the average threshold voltage was 17 V. Saturation mobilities of up to and including 1.5 cm$^2$/V·sec were measured for these devices. The average results are shown in TABLE II below.

TABLE II

Comparison of Inventive Polymer Dielectric and Comparative Dielectric in OFET Devices.

| | OFET Semi-conductor | $\mu_{avg}$ (cm$^2$/V·s) | $V_t$ (V) | $I_{on}/I_{off}$ |
|---|---|---|---|---|
| Comparative Example 4 | A-2 | 1.2 | 24 | 3 × 10$^6$ |
| Inventive Example 9 | A-2 | 2.8 | 17 | 4 × 10$^7$ |

The data in Table II clearly demonstrate the advantage of using the inventive polymers of the present invention over PMMA as dielectric layers. The overall performance of the invention OFET devices comprising inventive polymer as gate dielectrics is improved by more than a factor of 2 as judged by improved mobility.

Inventive Example 10

Synthesis of poly(styrene-co-octadecyl 4-vinylbenzoate)

A solution of styrene (4.00 g, 38 mmol), octadecyl 4-vinylbenzoate (0.40 g, 1 mmol), 2,2'-azobis(2-methylbutyronitrile) (52 mg, 0.03 mmol), and chlorobenzene (15 ml) was de-aerated by sparging with argon for 10 minutes, then heated under argon in a 70° C. oil bath for 18 hours. The mixture was cooled to room temperature, and the polymer was precipitated into excess methanol. The resulting white powder was collected, washed with methanol, and dried in a vacuum oven at 60° C. for 24 hours. The product polymer was obtained as a white powder, 2.02 g (46%). Analysis by size exclusion chromatography (SEC) indicated a weight average molar mass of 17,400 (polystyrene standards). The glass transition temperature was determined to be 71° C. by differential scanning calorimetry (DSC).

Inventive Example 11

Synthesis of a Polyester

A stirred mixture of Bisphenol A (4.05 g, 18 mmol), 4,4'-(1-methyloctadecylidene)bisphenol (0.87 g, 2 mmol), (4.49 g, 44 mmol) of triethylamine, and 50 ml of dry dichloromethane was treated with a suspension of terephthaloyl chloride (3.00 g, 15 mmol) and isophthaloyl chloride (0.99 g, 5 mmol) in 25 ml dry dichloromethane under argon. Remnants were washed in with 30 ml of additional dichloromethane. After stirring for 3 hours, the reaction mixture was washed successively with 2% aqueous HCl (2 times with 100 ml) and water (twice with 100 ml). The resulting inventive polymer was precipitated into excess methanol, and then dried in a vacuum oven at 60° C. The inventive polyester was obtained as 6.66 g (89%) of a white solid. Analysis by size exclusion chromatography (SEC) indicated a weight average molar mass ($M_w$) of 13,000 (polystyrene standards). The polyester glass transition temperature was determined to be 144° C. by differential scanning calorimetry (DSC).

Comparative Example 5

Synthesis of a Polyester

The synthetic procedure of Inventive Example 11 was followed, except that 4,4'-(1-methyloctadecylidene)bisphenol was omitted and the amount of Bisphenol A was increased to 4.49 g (20 mmol). The resulting comparative polyester was obtained as 6.30 g (86%) of white solid. The polyester glass transition temperature was determined to be 171° C. by differential scanning calorimetry (DSC).

The invention has been described in detail with particular reference to certain preferred embodiments thereof, but it will be understood that variations and modifications can be effected within the spirit and scope of the invention.

The invention claimed is:

1. A device comprising an organic semiconductor layer and a single dielectric layer in physical contact with the organic semiconductor layer,
the single dielectric layer consisting essentially of an organic film-forming polymer that has a glass transition temperature ($T_g$) of at least 70° C. and a number average molecular weight ($M_w$) of at least 20,000, the organic film-forming polymer comprising a backbone comprising at least 0.5 mol % and up to and including 25 mol % of recurring units represented by the following Structure (A), based on total organic film-forming polymer recurring units:

(A)

wherein X is an organic backbone unit, n is 0 or 1, G is a substituted or unsubstituted divalent organic linking group other than oxyarylene, $R^1$ is a substituted or unsubstituted aliphatic group comprising at least 6 carbon atoms.

2. The device of claim 1, wherein n is 0 or 1 and when n is 1, G is a carbonyloxy group, amide group, substituted or unsubstituted phenylene group, oxy group, or thio group.

3. The device of claim 1, wherein $R^1$ is a monovalent hydrocarbon group having 12 to 40 carbon atoms.

4. The device of claim 1, wherein $R^1$ is a monovalent saturated long-chain alkyl group having 12 to 30 carbon atoms.

5. The device of claim 1, wherein the organic film-forming polymer backbone further comprises at least 75 mol % of the recurring units identified by the following Structure (B), based on total organic film-forming polymer recurring units:

(B)

wherein X' is an organic backbone unit, m is 0 or 1, G' is a divalent organic linking group, and $R^2$ is an aliphatic, aromatic, alicyclic, or cyclic group such that when the recurring unit represented by Structure (B) is part of a homopolymer, that homopolymer has a glass transition temperature of at least 100° C., and $R^1$ and $R^2$ are different groups.

6. The device of claim 5, wherein $R^2$ is a hydrocarbon having 1 to 40 carbon atoms.

7. The device of claim 5, wherein G and G' are both carbonyloxy.

8. The device of claim 1 comprising an n-type or p-type organic field effect thin film transistor comprising the organic semiconductor layer and the single dielectric layer.

9. The device of claim 1, wherein the organic film-forming polymer has a glass transition temperature ($T_g$) of at least 70° C. and up to and including 250° C., and the organic film-forming polymer comprises at least 5 mol % and up to and including 20 mol % of recurring units represented by Structure (A) and at least 80 mol % and up to and including 95 mol % of recurring units represented by the following Structure (B), based on total organic film-forming polymer recurring units:

(B)

wherein X and X' represent the same or different organic backbone units, m is 0 or 1, G and G' are each a carbonyloxy group, $R^1$ is a monovalent hydrocarbon group having 12 to 40 carbon atoms, and $R^2$ is a substituted or unsubstituted hydrocarbon having 1 to 40 carbon atoms, and $R^1$ and $R^2$ are different groups.

10. The device of claim 1 that is a thin film transistor that comprises a gate electrode, the dielectric layer, the organic semiconductor layer, and source and drain electrodes formed on a substrate.

11. The device of claim 10 wherein the substrate is a glass substrate, silicon wafer, or a polymeric film.

12. The device of claim 1 that is a liquid crystal display device, a photovoltaic device, an organic light-emitting device, a sensor, a memory device, or an integrated circuit.

13. A composition for an organic polymer dielectric layer comprising a solvent and an organic film-forming polymer that has a glass transition temperature ($T_g$) of at least 70° C. and comprises a backbone comprising at least 0.5 mol % and up to and including 25 mol % of the recurring units identified by the following Structure (A), based on total organic film-forming polymer recurring units:

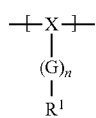

wherein X is an organic backbone unit, n is 0 or 1, G is a substituted or unsubstituted divalent organic linking group other than oxyarylene, $R^1$ is a substituted or unsubstituted aliphatic group comprising at least 6 carbon atoms.

14. An organic film-forming polymer that has a glass transition temperature ($T_g$) of at least 70° C. and comprises a backbone comprising at least 0.5 mol % and up to and including 25 mol % of the recurring units identified by the following Structure (A), based on total organic film-forming polymer recurring units:

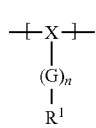

wherein X is an organic backbone unit, n is 0 or 1, G is a substituted or unsubstituted divalent organic linking group other than oxyarylene, $R^1$ is a substituted or unsubstituted aliphatic group comprising at least 6 carbon atoms.

15. A method for preparing an electronic device comprising:
independently applying a dielectric composition and an organic semiconductor composition to a substrate so that, when dried, the applied dielectric composition forms a single dielectric layer that is in physical contact with the applied organic semiconductor composition,
wherein the dielectric composition comprises an organic film-forming polymer that has a glass transition temperature ($T_g$) of at least 70° C. and comprises a backbone comprising at least 0.5 mol % and up to and including 25 mol % of the recurring units identified by the following Structure (A), based on total organic film-forming polymer recurring units:

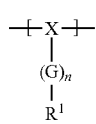

wherein X is an organic backbone unit, n is 0 or 1, G is a substituted or unsubstituted divalent organic linking group other than oxyarylene, $R^1$ is a substituted or unsubstituted aliphatic group comprising at least 6 carbon atoms.

16. The method of claim 15 comprising:
applying the dielectric composition to the substrate that is electrically conducting to form a gate dielectric layer,
removing the solvent from the coated gate dielectric layer to dry it,
applying the organic semiconductor composition to the gate dielectric layer to form an organic semiconductor layer, and
forming one or more sets of electrically conductive source and drain electrodes on the organic semiconductor layer.

17. A process for fabricating a thin-film semiconductor device, comprising:
providing a substrate,
providing a gate electrode material over the substrate,
providing an organic film-forming polymer dielectric gate layer over the gate electrode material,
depositing a thin film of an organic semiconductor material, and
providing a source electrode and a drain electrode contiguous to the thin-film of the organic semiconductor material,
wherein the organic film-forming polymer dielectric gate layer comprises an organic film-forming polymer that has a $T_g$ of at least 70° C. and comprises a backbone comprising at least 0.5 mol % and up to and including 25 mol % of the recurring units identified by the following Structure (A), based on total organic film-forming polymer recurring units:

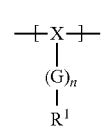

wherein X is an organic backbone unit, n is 0 or 1, G is a substituted or unsubstituted divalent organic linking group other than oxyarylene, $R^1$ is a substituted or unsubstituted aliphatic group comprising at least 6 carbon atoms.

18. The process of claim 17 wherein the substrate is a flexible substrate.

* * * * *